US012757801B2

(12) United States Patent
Nagarajan et al.

(10) Patent No.: US 12,757,801 B2
(45) Date of Patent: Oct. 6, 2026

(54) COPPER RINGS FOR BGA COUNT REDUCTION IN SMALL FORM FACTOR PACKAGES

(71) Applicant: Intel Corporation, Santa Clara, CA (US)

(72) Inventors: Kavitha Nagarajan, Bangalore (IN); Min Suet Lim, Gelugor (MY); Eng Huat Goh, Ayer Itam (MY); Telesphor Kamgaing, Chandler, AZ (US); Chee Kheong Yoon, Bayan Lepas (MY); Jooi Wah Wong, Bukit Mertajam (MY); Chu Aun Lim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 17/849,352

(22) Filed: Jun. 24, 2022

(65) Prior Publication Data

US 2023/0420345 A1 Dec. 28, 2023

(51) Int. Cl.
*H01L 23/538* (2006.01)
*H01L 23/00* (2006.01)
(Continued)

(52) U.S. Cl.
CPC ....... *H10W 90/701* (2026.01); *H10W 44/601* (2026.01); *H10W 70/65* (2026.01);
(Continued)

(58) Field of Classification Search
CPC ......... H01L 23/49838; H01L 23/49822; H01L 23/49866; H01L 23/49894; H01L 23/49833; H01L 21/4853; H01L 21/4857; H01L 23/3735; H01L 23/5383; H01L 2924/1517; H01L 23/585; H01L 2924/19041; H01L 2924/30105; H01L 23/642; H01L 2924/35–3512; H01L 23/562; H01L 23/552; H01L 2924/3025; H01L 23/60; H01L 23/66; H01L 24/16; H01L 24/17; H01L 23/49816; H01L 23/3128; H01L 23/50; H01L 2924/15311; H01L 2924/15321; H01L 2924/15331; H01L 2924/1421; H10W 72/932; H10W 70/65; H10W 72/20; H10W 72/232; H10W 72/247; H10W 72/248;
(Continued)

(56) References Cited

U.S. PATENT DOCUMENTS 6,160,705 A * 12/2000 Stearns .................. H01L 24/49 257/E23.079
9,899,305 B1 * 2/2018 Yeh ...................... H01L 23/562
(Continued)

*Primary Examiner* — Wael M Fahmy
*Assistant Examiner* — Aneesa Riaz Baig
(74) *Attorney, Agent, or Firm* — Schwabe, Williamson & Wyatt P.C.

(57) ABSTRACT

Embodiments disclosed herein include electronic packages. In an embodiment, the electronic package comprises a die. In an embodiment, a package substrate is coupled to the die. In an embodiment, a ring is provided under the package substrate. In an embodiment, the ring comprises a conductive material. In an embodiment, the electronic package further comprises balls outside of the ring.

19 Claims, 11 Drawing Sheets

(51) Int. Cl.

| | |
|---|---|
| ***H01L 25/065*** | (2023.01) |
| ***H10W 44/00*** | (2026.01) |
| ***H10W 70/65*** | (2026.01) |
| ***H10W 70/68*** | (2026.01) |
| ***H10W 70/685*** | (2026.01) |
| ***H10W 90/00*** | (2026.01) |

(52) U.S. Cl.
CPC ........... *H10W 70/68* (2026.01); *H10W 90/00* (2026.01); *H10W 90/401* (2026.01); *H10W 70/685* (2026.01); *H10W 90/724* (2026.01)

(58) Field of Classification Search
CPC ....... H10W 90/722–7295; H10W 90/731–739; H05K 2201/10734; H05K 2201/09418
See application file for complete search history.

(56) References Cited

U.S. PATENT DOCUMENTS

2002/0034066 A1* 3/2002 Huang ................ H01L 23/3677 257/E23.105
2005/0090070 A1* 4/2005 Gilgen ................... H10D 1/712 257/E21.019
2015/0237731 A1* 8/2015 Toyama ............... H05K 1/0231 361/760
2018/0108605 A1* 4/2018 Hossain ................ H01L 21/486
2018/0114748 A1* 4/2018 Yow ...................... H10W 70/65
2018/0323170 A1* 11/2018 Kim .................... H01L 21/4853
2020/0006196 A1* 1/2020 Lin ..................... H01L 23/5389
2020/0286983 A1* 9/2020 Liu ....................... H01L 23/642

* cited by examiner

COPPER RINGS FOR BGA COUNT REDUCTION IN SMALL FORM FACTOR PACKAGES

TECHNICAL FIELD

Embodiments of the present disclosure relate to electronic packages, and more particularly to packaging architectures that include copper rings for power and ground delivery at the bottom of the package substrate underneath the die.

BACKGROUND

Larger die size and IO count limits the package size, and it is extremely important to optimize the die to package ratio for small form factor segments. When there is a need for land side capacitors (LSCs) on the package for the power rails, a cavity (i.e., the absence of solder balls) is created underneath the die area and the inner most balls of the array will be defined as non-critical to function (NCTF) or reserved critical to function (RCTF). Hence these balls cannot be effectively used for any signal or power assignments. The actual signal assignment starts after these rows, and this has an impact on the overall form factor in terms of the XY dimensions.

There is currently no good solution to avoid NCTFs and RCTFs as the dies are large and need to have more NCTFs and RCTFs in order to meet a warpage cliff. Additionally, die thinning results in thermal issues. Accordingly, avoiding the need for two or more rows of NCTFs and RCTFs is not currently possible. This results in any signal or power assignments being started after these rows. As such, there is a need to extend the peripheral rows and/or columns of the balls. Additionally, the package becomes bottom fit, and results in an increase in the package form factor with respect to the XY dimensions. Effective power balls are also moved away from the power bumps on the die. Ideally, the location of the power balls is directly underneath the power bumps of the die.

EMBODIMENTS OF THE PRESENT DISCLOSURE

Described herein are packaging architectures that include copper rings for power and ground delivery at the bottom of the package substrate underneath the die, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
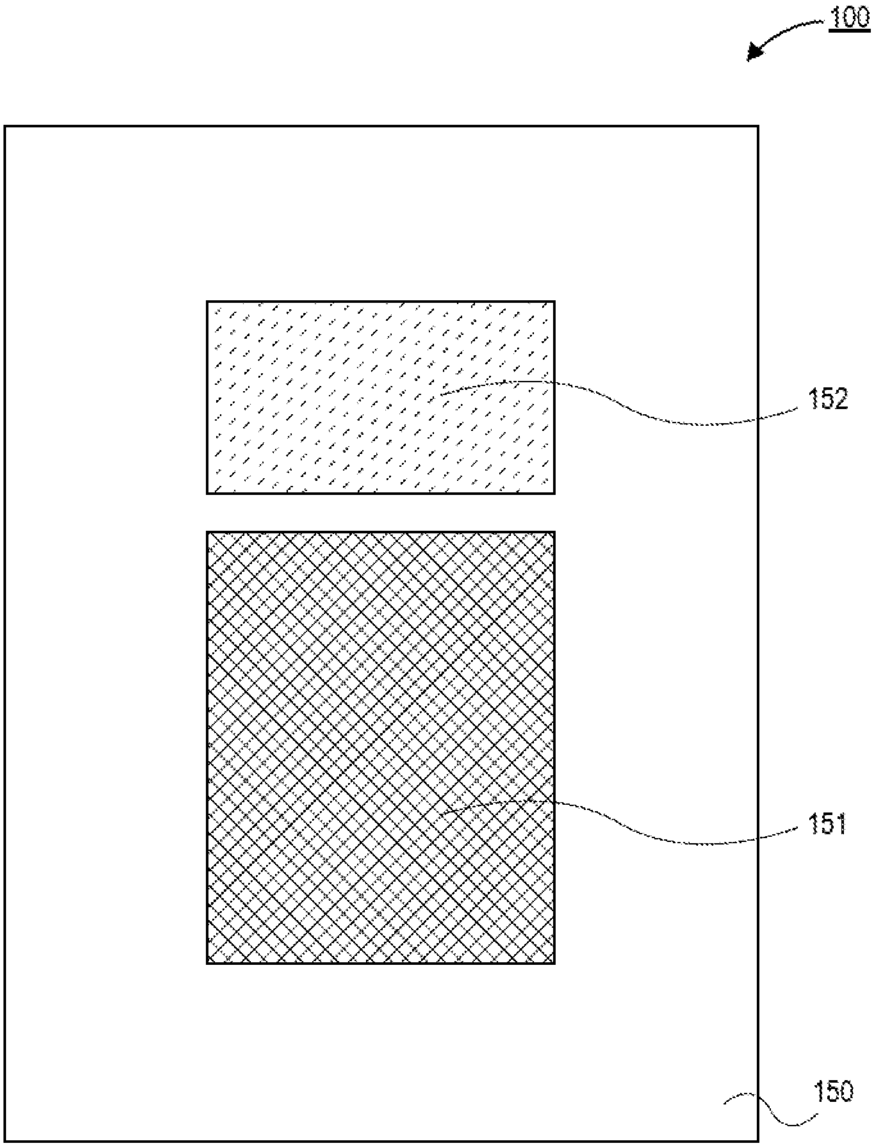
FIG. 1A is a plan view illustration of an electronic package with a package substrate and a pair of dies on the package substrate.
Figure 1B:
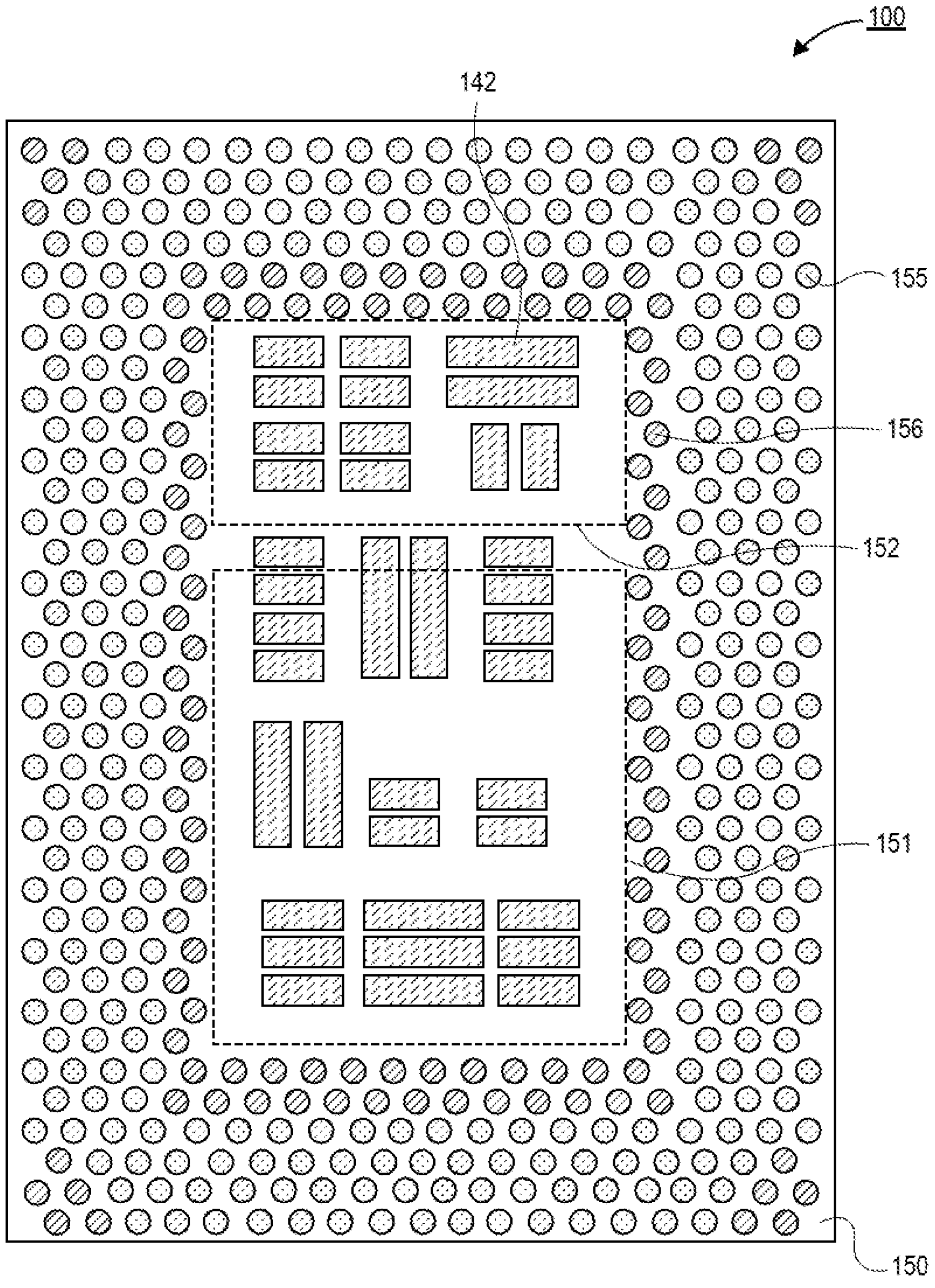
FIG. 1B is a plan view illustration of a backside surface of the package substrate in FIG. 1A.

In order to provide context to embodiments disclosed herein, FIGS. 1A and 1B are provided in order to explain certain issues that arise with existing electronic packaging architectures. In FIG. 1A, a plan view illustration of a top surface of an electronic package 100 is shown. The electronic package 100 may include a package substrate 150. The package substrate 150 may be a cored or coreless package substrate. The package substrate 150 may provide routing (not shown) in order to redistribute the positioning of bumps below one or more dies on the package substrate. For example, a pair of dies 151 and 152 are provided on the package substrate 150 in FIG. 1A. The dies 151 and 152 may be any type of die. For example, die 151 may be a compute die (e.g., a central processing unit (CPU), a graphics processing unit (GPU), a DDR memory, High Speed IOs or the like). In some implementations, the second die 152 may be a general purpose IO (GPIO) die, or the like.

Referring now to FIG. 1B, a plan view illustration of a backside surface of the electronic package 100 is shown. The overlying dies 151 and 152 are illustrated with dashed lines in order to indicate that they are on the opposite surface of the package substrate 150. As shown, an array of balls 155 and 156 may be provided on the backside of the package substrate 150. The array of balls 155 may be referred to as having a cavity in the middle of the package substrate 150 below the dies 151 and 152. As used herein, a "cavity" may refer to the absence of balls in an array of balls 155 and 156. That is, a cavity may not necessarily be a hole, trench, or the like into a substrate, such as the package substrate 150 or a board (not shown).

As shown, a plurality of capacitors 142, such as land side capacitors (LSCs), may be provided in the cavity below the dies 151 and 152. The capacitors 142 may be used for power delivery purposes, and are ideally provided within a footprint of the dies 151 and 152. The requirement to include capacitors 142 at the center of the package substrate 150 causes several drawbacks. One drawback is that the center of the package substrate 150 can no longer be used for signal, ground, or power bumping. This spreads the balls out laterally and increases the XY form factor of the electronic package 100. Additionally, due to warpage and other mechanical issues, not all of the balls 155 can be used as functional balls. For example, the balls 156 may be referred to as non-critical to function (NCTF) or reserve-critical to function (RCTF) balls. That is, the balls 156 may not be used in the active circuitry of the electronic package 100. Typically, balls 156 at the corner are NCTF balls 156. Additionally, the formation of the cavity results in NCTF balls 156 around the perimeter of the cavity. For example, one, two, or three rows out from the cavity are classified as NCTF balls 156. Since the NCTF balls 156 cannot be used for signaling, power, ground, etc., additional balls 155 are needed at the periphery of the array of balls 155. This also increases the XY form factor of the electronic package 100. Additionally, power delivery performance may be negatively impacted since power balls are moved further away from the power bumps of the dies 151 and 152.

Accordingly, embodiments disclosed herein include the use of conductive rings for power and ground at the bottom of the package underneath the die in the NCTF and RCTF area. That is, the rings replace the NCTF/RCTF balls. The rings can then function to provide power and ground delivery, and the space is no longer wasted. This allows for a reduction in the XY form factor of the package substrate.

In some embodiments, one of the rings (e.g., the outer ring) may be partitioned into a plurality of segments in order to be assigned to different power rails. The rings can be used to supply the power rails from the board. Additionally, due to the continuous ring structure, there is a reduction in the number of balls needed for each of the power rails. Furthermore, the ring structure may also function as a stiffener in order to provide improve planarity during reflow.

In an embodiment, the advantages of architectures disclosed herein include ball count reduction and form factor reduction. This approach will reduce the number of power balls needed on the package, which will help in package form factor reduction, unlike having balls under the die region which will end up as NCTF balls. Embodiments also improve power delivery from the board, as the rings are closer to the die bumps. The ring structure between the package and the board will also act as a stiffener which will improve package warpage during reflow.

Figure 2A:
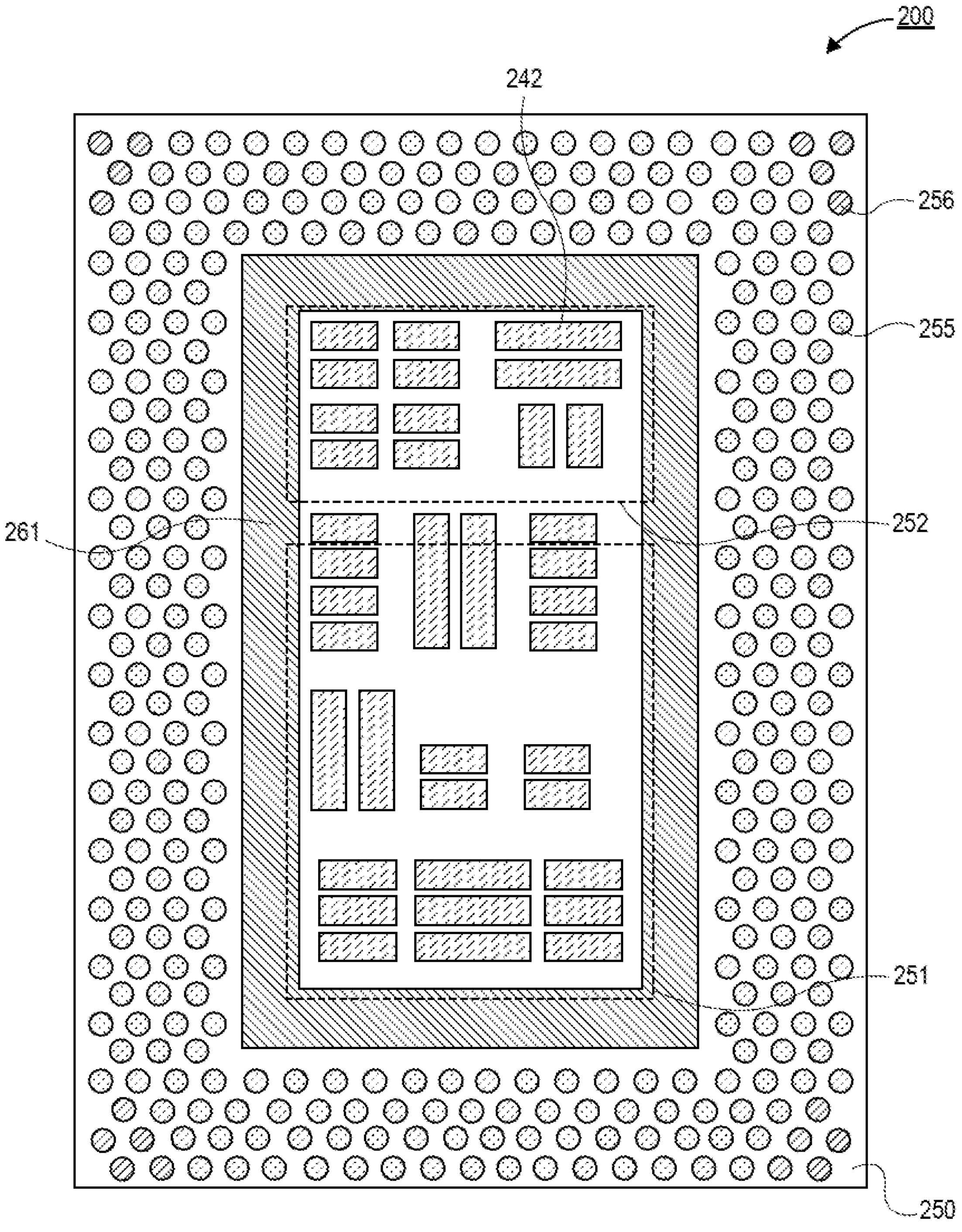
FIG. 2A is a plan view illustration of a backside surface of a package substrate with a conductive ring around the cavity and capacitors in the cavity, in accordance with an embodiment.

Referring now to FIG. 2A, a plan view illustration of a backside surface of an electronic package 200 is shown, in accordance with an embodiment. In an embodiment, the electronic package 200 includes a package substrate 250. The package substrate 250 may be a cored or coreless package substrate. The package substrate 250 may include conductive routing (not shown) that couples bumps from one or more dies 251 and 252 on the front side surface of the package substrate 250 to balls 255 on the backside surface of the package substrate 250.

In the illustrated embodiment, the dies 251 and 252 are shown with dashed lines in order to indicate that they are on the opposite side of the package substrate 250 from the view shown in FIG. 2A. The dies 251 and 252 may include any type of die. For example, the die 251 may be a compute die, such as a CPU, a GPU, DDR memory, High Speed IOs or the like. The die 252 may be a GPIO die.

In an embodiment, the array of balls 255 may include a cavity where no balls are located. The cavity may be provided below a footprint of the dies 251 and 252. In an embodiment, one or more capacitors 242 may be provided in the cavity below the dies 251 and 252. The capacitors may be LSCs or the like. In an embodiment, the array of balls 255 may also include one or more NCTF or RCTF balls 256. However, unlike the architecture described above in FIG. 1B, the NCTF balls 256 are only located at the corner regions of the package substrate 250. That is, there are no NCTF balls 256 around a perimeter of the cavity.

In an embodiment, the NCTF balls 256 that were at the boundary of the cavity are replaced with a ring 261. The ring 261 may be a conductive material, such as copper. In an embodiment, the ring 261 is a discrete component that is added to the package substrate 250 with a surface mounting process. That is, the ring 261 may not be fabricated as part of the package substrate (e.g., with plating or deposition processes). However, in some embodiments, the ring 261 may be fabricated as an integral part of the package substrate 250. The ring 261 has improved mechanical robustness compared to solder balls. As such, the mechanical reliability of the ring 261 is improved compared to the use of solder balls. This allows for the ring 261 to be used as a functioning part of the circuitry of the electronic package 200. Replacing the NCTF balls with a functional ring 261 allows for fewer bumps to be needed in the array of bumps 255. Therefore, space in the XY dimension may be saved in order to reduce the form factor of the electronic package 200.

In an embodiment, the ring 261 may be partially within a footprint of the dies 251 and 252. For example, the ring 261 may be at an edge of the dies 251 and 252 and extend outwards. Since the ring 261 is closer to the dies 251 and 252 than balls 255 are, power delivery to the dies 251 and 252 is improved. In some embodiments, the ring 261 may be configured to be a connected to a ground voltage. In other embodiments, the ring 261 may be configured to be connected to a voltage for a power domain for one of the dies 251 and 252. The ring 261 may also function as a stiffener in order to improve warpage of the package substrate 250.

Figure 2B:
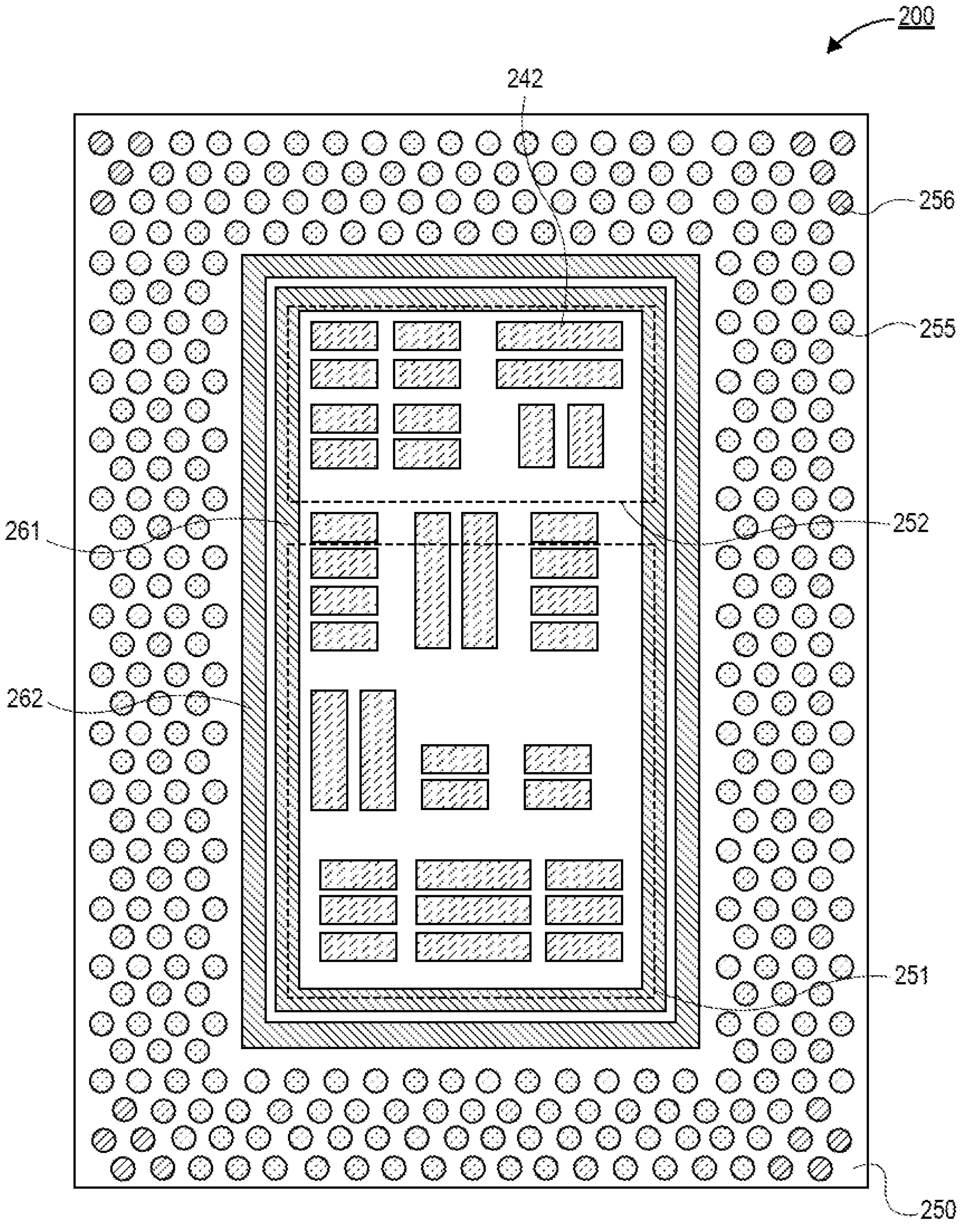
FIG. 2B is a plan view illustration of a backside surface of a package substrate with a first ring and a second ring around the cavity with capacitors in the cavity, in accordance with an embodiment.

Referring now to FIG. 2B, a plan view illustration of an electronic package 200 is shown, in accordance with an additional embodiment. In an embodiment, the electronic package 200 may include a package substrate 250. An array of balls 255 may be provided over the backside surface of the package substrate 250. The array of balls 255 may include a cavity in the middle of the package substrate 250 where there are no balls 255. The array of balls 255 may also include NCTF balls 256 at corners of the package substrate 250 in some embodiments. Dies 251 and 252 (indicated with dashed lines) are provided over the cavity on the opposite surface of the package substrate 250. In an embodiment, capacitors (e.g., LSCs) may be provided in the cavity below the dies 251 and 252.

In an embodiment, a first ring 261 and a second ring 262 may be provided around the outer perimeter of the cavity. In an embodiment, the first ring 261 and the second ring 262 may be rectangular shaped rings. The first ring 261 may be electrically isolated from the second ring 262. For example, the first ring 261 may be configured to be held at a ground voltage, and the second ring 262 may be configured to be held at a voltage for power delivery to one or both of the dies 251 and 252. In other embodiments, the inner first ring 261 may be used for power delivery, and the outer second ring 262 may be held at a ground voltage. In an embodiment, the first ring 261 and the second ring 262 may also function as a stiffener in order to improve warpage of the package substrate 250.

Figure 3A:
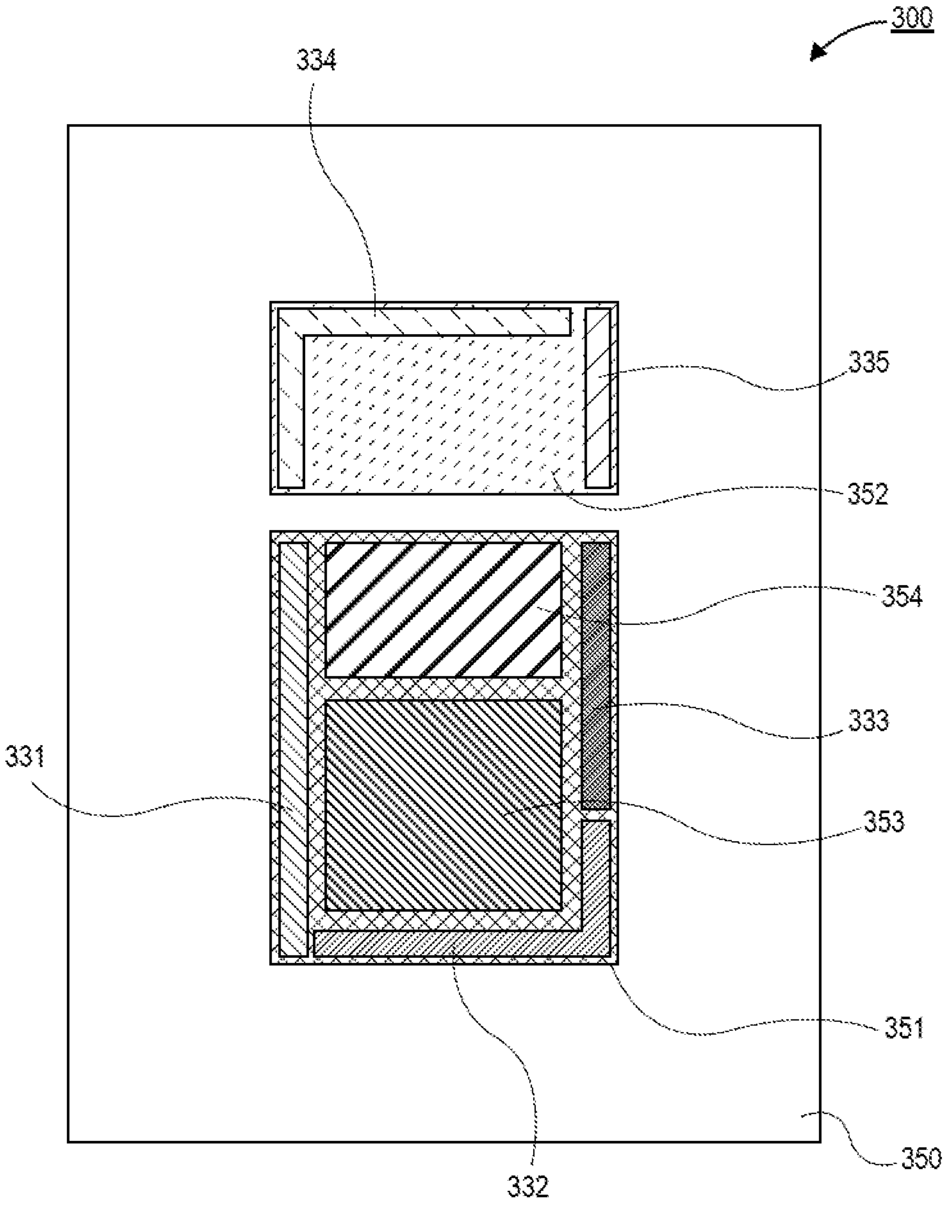
FIG. 3A is a plan view illustration of an electronic package with a pair of dies on the package substrate that illustrates the different power domains of the dies, in accordance with an embodiment.

Referring now to FIG. 3A, a plan view illustration of an electronic package 300 is shown, in accordance with an embodiment. In an embodiment, the electronic package 300 includes a package substrate 350. One or more dies 351 and 352 may be provided on a surface of the package substrate 350. The dies 351 and 352 may be any type of dies. For example, the first die 351 may be a compute die (e.g., a CPU, a GPU, DDR memory, High Speed IOs, etc.), and the second die 352 may be a GPIO die.

In the illustrated embodiment, the power rail groupings are shown for each of the dies 351 and 352. The first die 351 may include three power rail groupings along the edges of the first die 351. While three power rail groupings are shown, it is to be appreciated that any number of power rail groupings may be included in other embodiments. For example, the power rail groupings may include a DDR power rail 331, a first high speed IO (HSIO) power rail 332, and a second HSIO power rail 333. A compute core 353 and a graphics core 354 may be provided within the first die 351. In an embodiment, the second die 352 may include one or more power rail groupings along edges of the second die 352. For example, a general purpose IO (GPIO) power rail 334 and another IO power rail 335 may be provided on the second die 352. That is, a total of five power rails may be provided on the dies 351 and 352. However, it is to be appreciated that any number of power rails may be included in accordance with different embodiments.

Figure 3B:
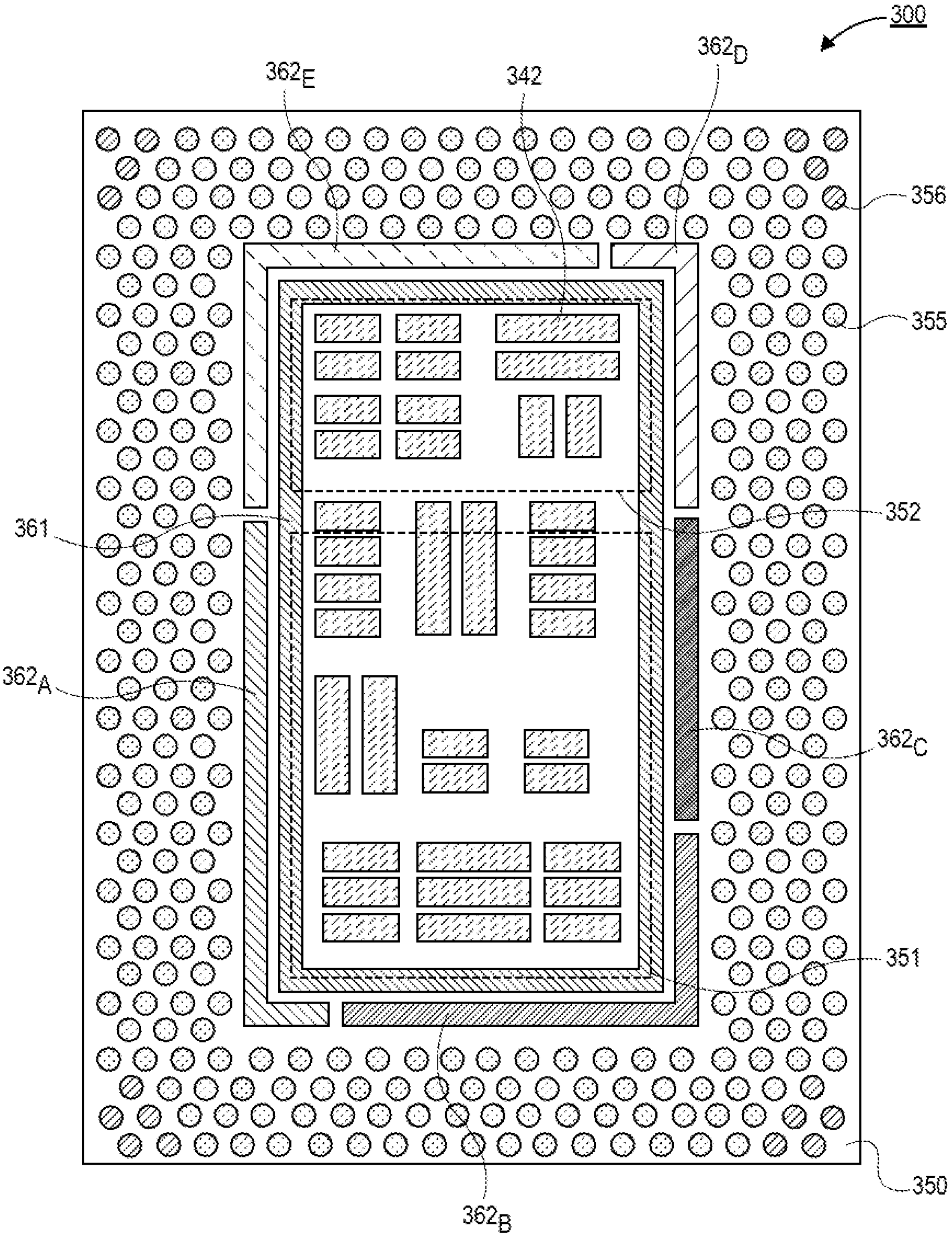
FIG. 3B is a plan view illustration of the backside surface of the package substrate with a first ring and a second ring that is partitioned into a plurality of segments to service each of the power domains, in accordance with an embodiment.

Referring now to FIG. 3B, a plan view illustration of the electronic package 300 is shown, in accordance with an embodiment. The view in FIG. 3B is of the opposite surface of the package substrate 350 from the surface shown in FIG. 3A. As such, the dies 351 and 352 are shown with dashed lines in order to indicate that they are on the opposite surface of the package substrate 350. In an embodiment, the package substrate 350 may include an array of balls 355. The array of balls 355 may include a cavity where there are no balls 355. For example, the cavity may be provided below the dies 351 and 352. In an embodiment, one or more capacitors 342 (e.g., LSCs) may be provided in the cavity. The array of balls 355 may also include NCTF balls 356. For example, the NCTF balls 356 may be located at corners of the package substrate 350. That is, there are no NCTF balls 356 around the perimeter of the cavity.

In an embodiment, a pair of rings 361 and 362 are provided inside the cavity and around the capacitors 342. In an embodiment, a first ring 361 may be a continuous ring, and the second ring 362 may be partitioned into a plurality of segments $\mathbf{362}_A$-$\mathbf{362}_E$. The first ring 361 may be configured to be held at a ground voltage during operation of the electronic package 300. The segments of the second ring 362 may be configured to be held at different voltages in order to service the various power domains described above with respect to FIG. 3A. The segments $\mathbf{362}_A$-$\mathbf{362}_E$ may each be located proximate to the various power domains. For example, segment $\mathbf{362}_A$ may be provided below the DDR power domain 331, segment $\mathbf{362}_E$ may be provided below the first HSIO power domain 332, segment $\mathbf{362}_C$ may be provided below the second HSIO power domain 333, segment $\mathbf{362}_D$ may be provided below the IO power domain 335, and segment $\mathbf{362}_E$ may be provided below the GPIO power domain 334.

Figure 4A:
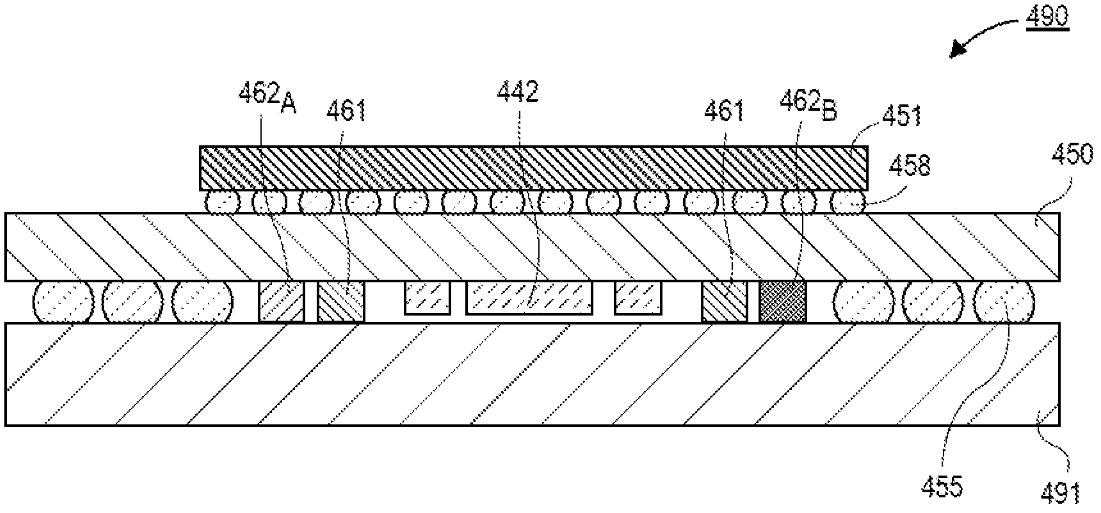
FIG. 4A is a cross-sectional illustration of an electronic system with an electronic package that includes a pair of rings around a cavity under the die, in accordance with an embodiment.

Referring now to FIG. 4A, a cross-sectional illustration of an electronic system 490 is shown, in accordance with an embodiment. In an embodiment, the electronic system 490 includes a board 491. The board 491 may be a printed circuit board (PCB) or the like. In an embodiment a package substrate 450 is coupled to the board 491. For example, balls 455 may be used to electrically couple the package substrate 450 to the board 491. In an embodiment, a cavity is provided over a center of the backside of the package substrate 450. That is, there may be no balls 455 at a center of the package substrate 450. In an embodiment, one or more capacitors 442 may be provided in the cavity between the package substrate 450 and the board 491.

In an embodiment, a first ring 461 may be provided around the capacitors 442. The first ring 461 may be configured to be held at a ground voltage during operation of the electronic system 490. In an embodiment, a second ring 462 may be provided around the first ring 461. As shown, the second ring 462 may be partitioned into segments $\mathbf{462}_A$ and $\mathbf{462}_B$. The different segments $\mathbf{462}_A$ and $\mathbf{462}_B$ may be configured to be held at different voltages during operation of the electronic system 490 in order to accommodate different power rails of the overlying die 451. In an embodiment, the die 451 may be provided over the package substrate 450. The die 451 may be coupled to the package substrate 450 by interconnects 458, such as solder balls or any other first level interconnect (FLI) architecture. In an embodiment, the first ring 461 and the second ring 462 may be provided within a footprint of the die 451. In other embodiments, the first ring 461 and the second ring 462 may be provided at an edge of the footprint of the die 451. That is a portion (or all) of the first ring 461 and the second ring 462 may be provided outside of a footprint of the die 451.

Figure 4B:
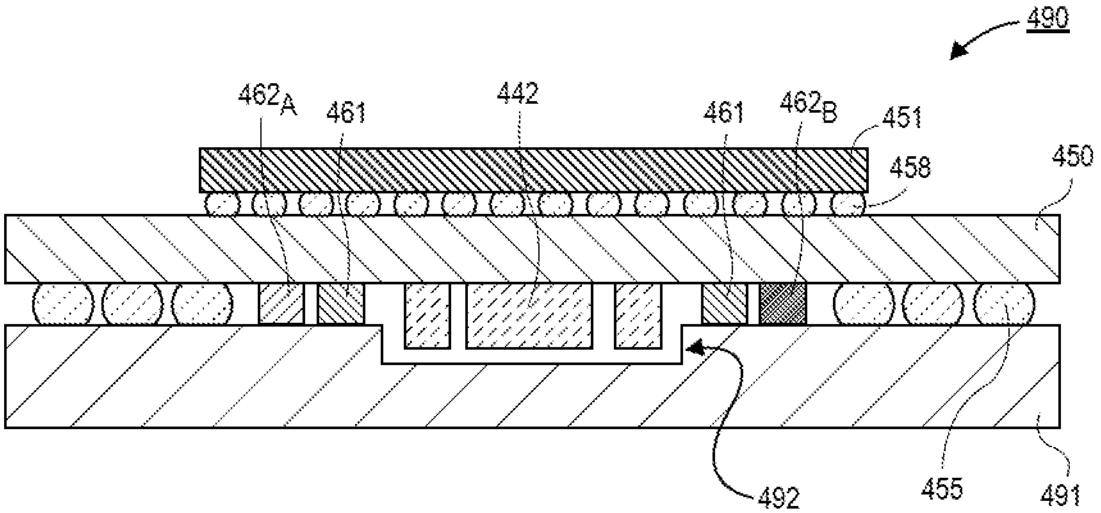
FIG. 4B is a cross-sectional illustration of an electronic system with an electronic package that includes a pair of rings, and a board that includes a recess to accommodate capacitors on the package substrate, in accordance with an embodiment.

Referring now to FIG. 4B, a cross-sectional illustration of an electronic system 490 is shown, in accordance with an embodiment. In an embodiment, the electronic system 490 may be substantially similar to the electronic system 490 in FIG. 4A, with the exception of the architecture of the board 491. Instead of having a planar surface that faces the package substrate 450, the board 491 may include a recess 492. The recess 492 may be provided under the capacitors 442. The recess 492 may be provided in order to accommodate the standoff height of the capacitors 442. For example, a standoff height of the capacitors 442 may be greater than standoff heights of the rings 461 and 462 and the balls 455. As such, the recess 492 allows for the capacitors 442 to be provided between the package substrate 450 and the board 491 without impacting the connections with the rings 461 and 462 or the balls 455.

Referring now to FIGS. 5A-5F, a series of cross-sectional illustrations depicting a process for forming an electronic system 590 is shown, in accordance with an embodiment. In an embodiment, the electronic system 590 may be substantially similar to the electronic systems 490 described above with respect to FIGS. 4A and 4B.

Figure 5A:
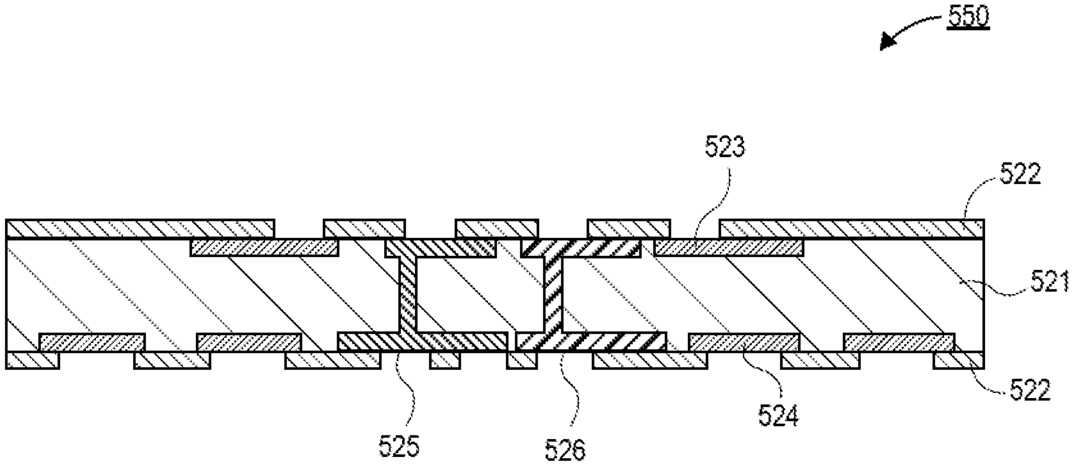
FIG. 5A is a cross-sectional illustration of a package substrate, in accordance with an embodiment.

Referring now to FIG. 5A, a cross-sectional illustration of a package substrate 550 is shown, in accordance with an embodiment. In an embodiment, the package substrate 550 includes a substrate 521. The substrate 521 may be formed of laminated buildup layers. Conductive routing may be provided in the buildup layers of the substrate 521. In an embodiment, the substrate 521 may have a core, or the substrate 521 may be coreless. In an embodiment, pads 523 may be provided at a top surface of the substrate 521, and pads 524 may be provided at a bottom surface of the substrate 521. Solder resist layers 522 or the like may be provided over the top and bottom surface of the substrate 521. In an embodiment, pad 525 and pad 526 may be provided at a bottom of the substrate 521 in order to accommodate the rings attached in a subsequent processing operation.

Figure 5B:
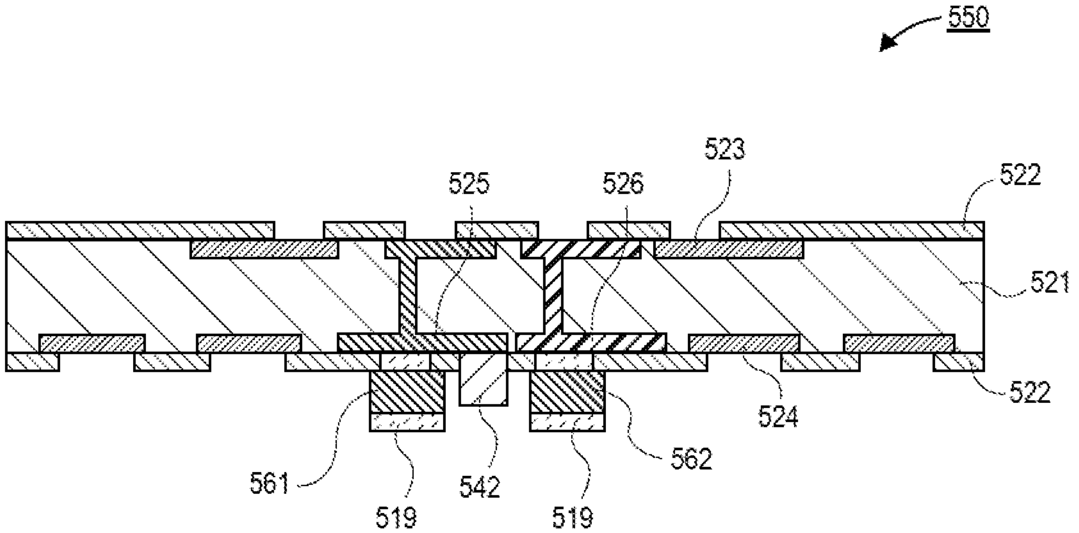
FIG. 5B is a cross-sectional illustration of the package substrate after a capacitor and rings are attached to the package substrate, in accordance with an embodiment.

Referring now to FIG. 5B, a cross-sectional illustration of the package substrate 550 after rings 561 and 562 are attached is shown, in accordance with an embodiment. In an embodiment, the rings 561 and 562 may be attached to the pads 525 and 526 by a solder or the like. The rings 561 and 562 may be discrete structures that are mounted to the package substrate 550. For example, the rings 561 and 562 may be copper rings or the like. The ring 561 may be a single continuous ring, and the ring 562 may be partitioned into a plurality of segments, as described in greater detail above. In an embodiment, solder 519 may be provided on the bottom surfaces of the rings 561 and 562. In an embodiment, a capacitor 542 may also be attached to the bottom surface of the package substrate 550. While a single capacitor 542 is shown, it is to be appreciated that any number of capacitors 542 may be attached to the package substrate 550.

Figure 5C:
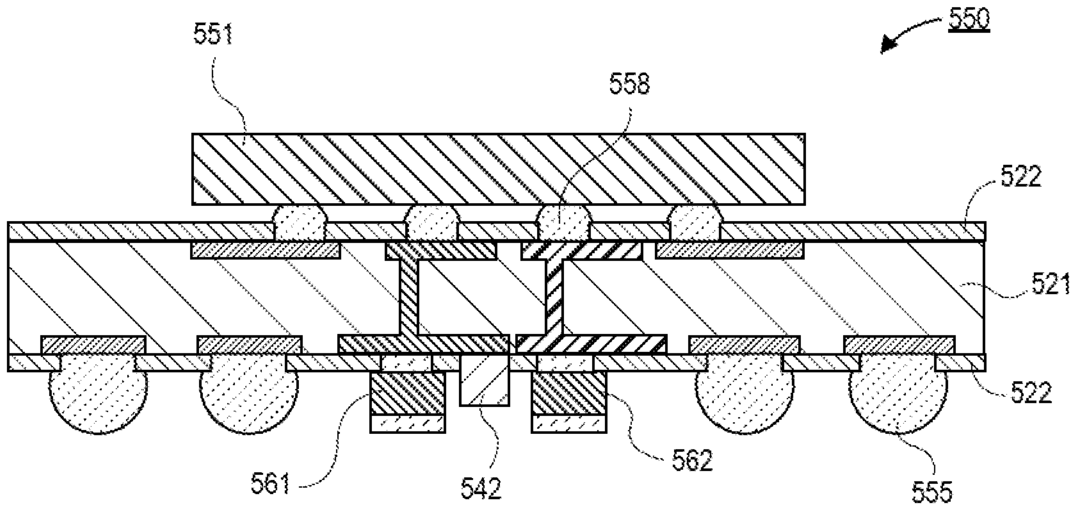
FIG. 5C is a cross-sectional illustration of the package substrate after a die and solder balls are attached, in accordance with an embodiment.

Referring now to FIG. 5C, a cross-sectional illustration of the package substrate 550 after a die 551 is attached is shown, in accordance with an embodiment. In an embodiment, the die 551 may be attached to the package substrate through interconnects 558. The interconnects 558 are shown as solder balls, but it is to be appreciated that any FLI architecture may be used to couple the die 551 to the package substrate 550. In an embodiment, balls 555 may also be provided over the pads on the bottom surface of the package substrate 550. In an embodiment, the balls 555 may be solder balls or the like.

Figure 5D:
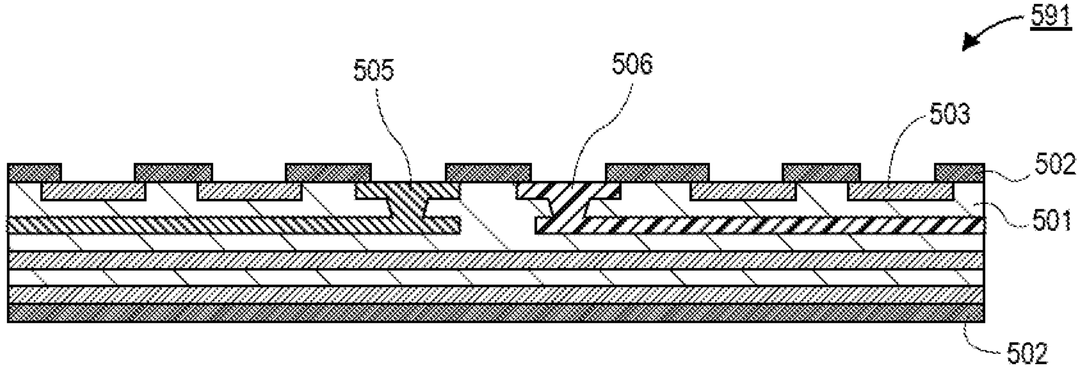
FIG. 5D is a cross-sectional illustration of a board that is to be attached to the package substrate, in accordance with an embodiment.

Referring now to FIG. 5D, a cross-sectional illustration of a board 591 is shown, in accordance with an embodiment. In an embodiment, the board 591 may include a substrate 501. The substrate 501 may be a PCB or the like. Routing layers may be provided in the substrate 501. Pads 503 may be provided on a top surface of the substrate 501. The pads 501 may also include pads 505 and 506. The pads 505 and 506 may be positioned in order to receive the rings 561 and 562 on the package substrate 550. In an embodiment, solder resist layers 502 or the like may be provided over and under the substrate 501.

Figure 5E:
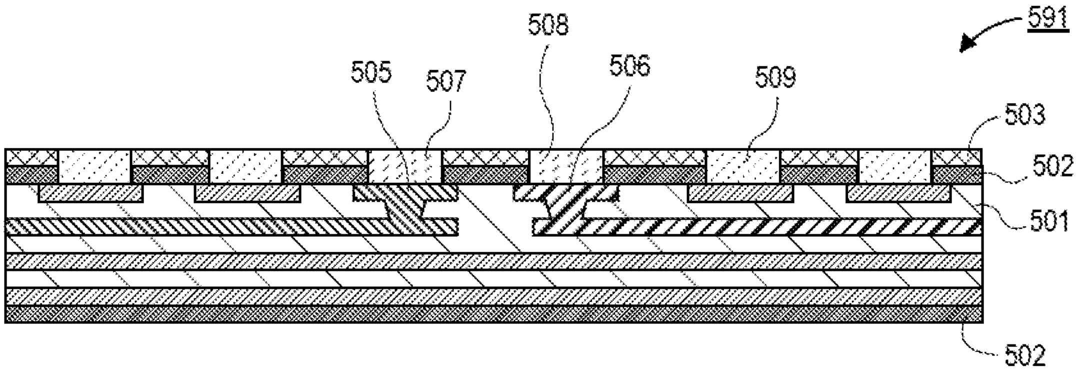
FIG. 5E is a cross-sectional illustration of the board after solder paste is printed on the openings, in accordance with an embodiment.

Referring now to FIG. 5E, a cross-sectional illustration of the board 591 is shown after solder printing is performed, in accordance with an embodiment. In an embodiment, a solder mask 503 may be provided over the solder resist 502. Solder 509 may then be printed into the openings through the solder resist 502 and the solder mask 503. Solder 507 and solder 508 may be provided over the surfaces of the pads 505 and 506 for the rings.

Figure 5F:
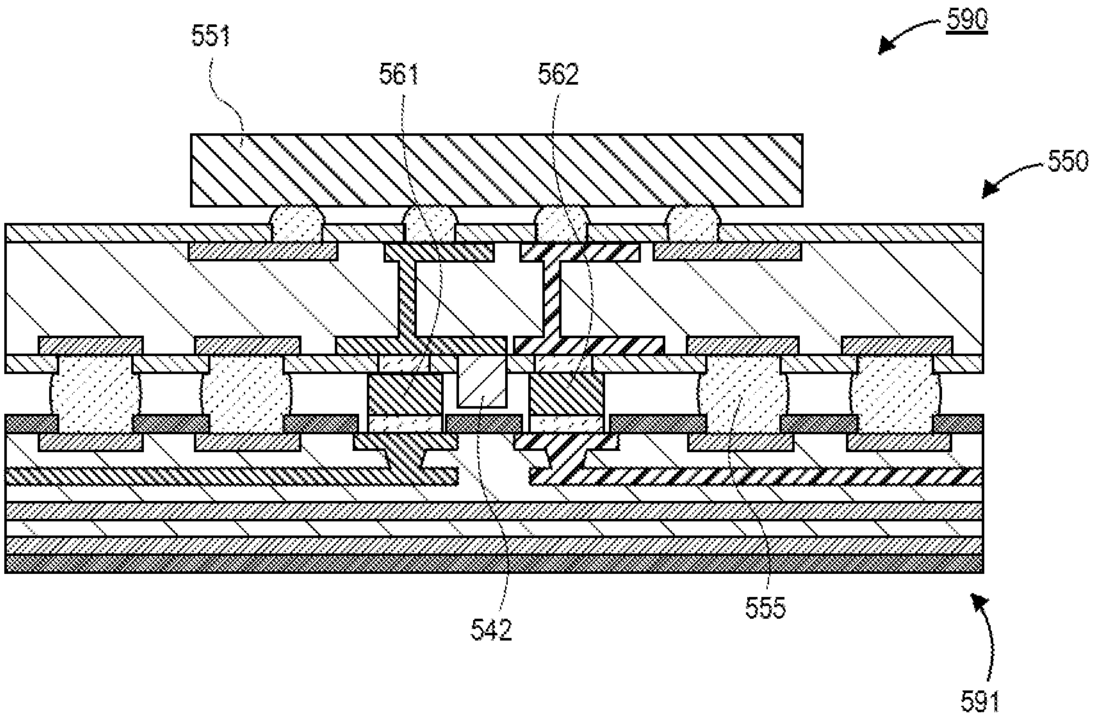
FIG. 5F is a cross-sectional illustration of package substrate coupled to the board to provide an electronic system, in accordance with an embodiment.

Referring now to FIG. 5F, a cross-sectional illustration of the electronic system 590 is shown, in accordance with an embodiment. The electronic system 590 may be formed by attaching the package substrate 550 in FIG. 5C to the board 591 in FIG. 5E. For example, a solder reflow process may be used in order to couple the package substrate 550 to the board 591. In an embodiment, the balls 555 may be provided outside of the rings 561 and 562. Additionally, a capacitor 542 may be provided between the rings 561 and 562. The rings 561 and 562 may be under a footprint of the die 551. In other embodiments, the rings 561 and 562 may be at an edge of the footprint of the die 551 or outside of the footprint of the die 551.

Figure 6:
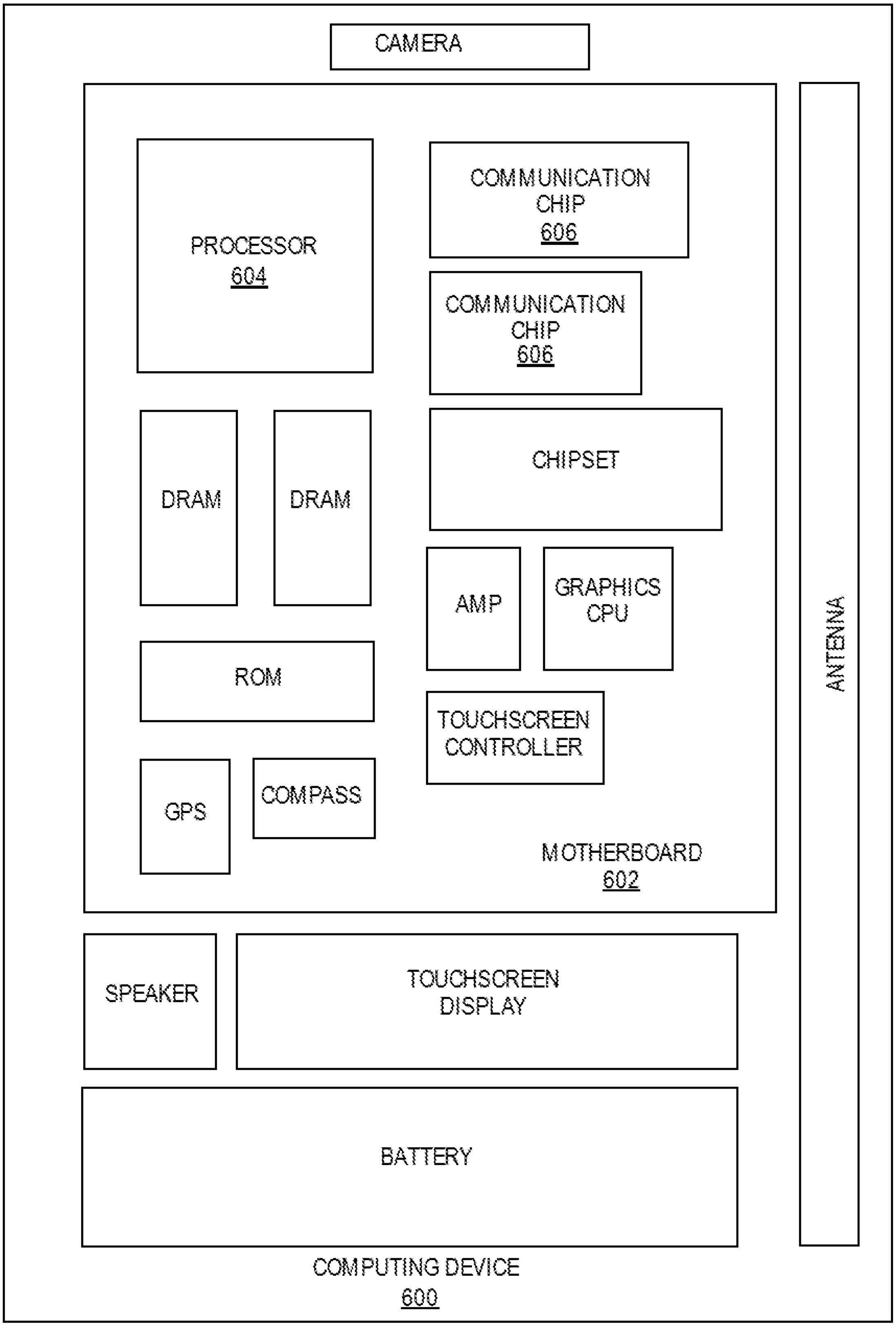
FIG. 6 is a schematic of a computing device built in accordance with an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor may be part of an electronic package that includes one or more discrete rings that provide ground and/or power delivery, where the rings are between the package substrate and the board, in accordance with embodiments described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip may be part of an electronic package that includes one or more discrete rings that provide ground and/or power delivery, where the rings are between the package substrate and the board, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a die; a package substrate coupled to the die; a ring under the package substrate, wherein the ring comprises a conductive material; and balls outside of the ring.

Example 2: the electronic package of Example 1, further comprising: a second ring around the first ring.

Example 3: the electronic package of Example 2, wherein the second ring comprises a plurality of segments.

Example 4: the electronic package of Example 3, wherein the plurality of segments are configured to be coupled to different power rails.

Example 5: the electronic package of Example 3 or Example 4, wherein the plurality of segments includes five or more segments.

Example 6: the electronic package of Examples 1-5, wherein the ring is configured to be grounded.

Example 7: the electronic package of Examples 1-6, further comprising: a plurality of dies coupled to the package substrate.

Example 8: the electronic package of Examples 1-7, further comprising a capacitor within the ring.

Example 9: the electronic package of Example 8, wherein a standoff height of the capacitor is greater than a standoff height of the ring.

Example 10: the electronic package of Example 8, wherein a standoff height of the capacitor is less than a standoff height of the ring.

Example 11: the electronic package of Examples 1-10, wherein a first row of balls outside of the ring are functional balls.

Example 12: the electronic package of Examples 1-11, wherein the ring is at least partially within a footprint of the die.

Example 13: a package substrate, comprising: a substrate with a first surface and a second surface opposite from the first surface; an array of balls on the second surface of the substrate, wherein the array of balls includes a cavity; a first ring inside the cavity; a second ring inside the cavity and around the first ring; and capacitors in the cavity.

Example 14: the package substrate of Example 13, wherein the cavity is a rectangular cavity.

Example 15: the package substrate of Example 13 or Example 14, wherein the first ring is electrically isolated from the second ring.

Example 16: the package substrate of Examples 13-15, wherein the second ring includes a plurality of segments, and wherein each segment is electrically isolated from each other.

Example 17: the package substrate of Example 16, wherein the plurality of segments are configured to be held at different voltages during operation of the package substrate.

Example 18: the package substrate of Examples 13-17, wherein the first ring is configured to be held at a ground voltage during operation of the package substrate.

Example 19: the package substrate of Examples 13-18, wherein a first row of bumps around a perimeter of the cavity are functional bumps.

Example 20: the package substrate of Examples 13-19, wherein a standoff height of the capacitor is different than a standoff height of the first ring or the second ring.

Example 21: the package substrate of Examples 13-20, further comprising: a die coupled to the first surface of the package substrate.

Example 22: the package substrate of Example 21, wherein the first ring is at least partially within a footprint of the die.

Example 23: an electronic system, comprising: a board; a package substrate coupled to the board, wherein the package substrate comprises: a first ring between the package substrate and the board; a second ring between the package substrate and the board, wherein the second ring is around the first ring: and balls between the package substrate and the board, wherein the balls are outside of the second ring; and a die coupled to the package substrate.

Example 24: the electronic system of Example 23, further comprising: a plurality of capacitors within a perimeter of the first ring.

Example 25: the electronic system of Example 23 or Example 24, wherein the first ring is configured to be grounded, and wherein the second ring comprises a plurality of segments that are configured to be held at different voltages.

What is claimed is:

1. An electronic package, comprising:

a die;

a package substrate coupled to the die;

a ring under the package substrate, wherein the ring comprises a conductive material, and wherein the die is entirely within an outermost perimeter of the ring from a plan view perspective;

balls outside of the ring; and a capacitor within the ring, wherein a standoff height of the capacitor is less than a standoff height of the ring.

2. The electronic package of claim 1, further comprising:

a second ring around the ring.

3. The electronic package of claim 2, wherein the second ring comprises a plurality of segments.

4. The electronic package of claim 3, wherein the plurality of segments are configured to be coupled to different power rails.

5. The electronic package of claim 3, wherein the plurality of segments includes five or more segments.

6. The electronic package of claim 1, wherein the ring is configured to be grounded.

7. The electronic package of claim 1, further comprising:

a plurality of dies coupled to the package substrate.

8. The electronic package of claim 1, wherein a first row of balls outside of the ring are functional balls.

9. The electronic package of claim 1, wherein the ring is at least partially within a footprint of the die.

10. A package substrate, comprising:

a substrate with a first surface and a second surface opposite from the first surface;

a die coupled to the first surface of the package substrate;

an array of balls on the second surface of the substrate, wherein the array of balls includes a cavity;

a first ring inside the cavity, wherein the die is entirely within an outermost perimeter of the first ring from a plan view perspective;

a second ring inside the cavity and around the first ring, wherein the second ring includes a plurality of segments, wherein each segment is electrically isolated from each other, and wherein the plurality of segments are configured to be held at different voltages during operation of the package substrate; and capacitors in the cavity.

11. The package substrate of claim 10, wherein the cavity is a rectangular cavity.

12. The package substrate of claim 10, wherein the first ring is electrically isolated from the second ring.

13. The package substrate of claim 10, wherein the first ring is configured to be held at a ground voltage during operation of the package substrate.

14. The package substrate of claim 10, wherein a first row of bumps around a perimeter of the cavity are functional bumps.

15. The package substrate of claim 10, wherein a standoff height of the capacitor is different than a standoff height of the first ring or the second ring.

16. An electronic system, comprising:

a board;

a package substrate coupled to the board, wherein the package substrate comprises:

a first ring between the package substrate and the board;

a second ring between the package substrate and the board, wherein the second ring is around the first ring, wherein the first ring is configured to be grounded, and wherein the second ring comprises a plurality of segments that are configured to be held at different voltages; and balls between the package substrate and the board, wherein the balls are outside of the second ring; and a die coupled to the package substrate, wherein the die is entirely within an outermost perimeter of the first ring from a plan view perspective.

17. The electronic system of claim 16, further comprising:

a plurality of capacitors within a perimeter of the first ring.

18. An electronic package, comprising:

a die;

a package substrate coupled to the die;

a ring under the package substrate, wherein the ring comprises a conductive material, and wherein the die is entirely within an outermost perimeter of the ring from a plan view perspective;

balls outside of the ring; and a capacitor within the ring, wherein a standoff height of the capacitor is greater than a standoff height of the ring.

19. A package substrate, comprising:

a substrate with a first surface and a second surface opposite from the first surface;

a die coupled to the first surface of the package substrate;

an array of balls on the second surface of the substrate, wherein the array of balls includes a cavity;

a first ring inside the cavity, wherein the die is entirely within an outermost perimeter of the first ring from a plan view perspective, and wherein the first ring is configured to be held at a ground voltage during operation of the package substrate;

a second ring inside the cavity and around the first ring; and capacitors in the cavity.

* * * * *